(12) United States Patent
Naberhuis

(10) Patent No.: US 7,209,430 B2
(45) Date of Patent: *Apr. 24, 2007

(54) DATA STORAGE DEVICE

(75) Inventor: Steven L. Naberhuis, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 671 days.

This patent is subject to a terminal disclaimer.

(21) Appl. No.: 10/646,178

(22) Filed: Aug. 22, 2003

(65) Prior Publication Data

US 2005/0041556 A1 Feb. 24, 2005

(51) Int. Cl.
*G11B 7/00* (2006.01)

(52) U.S. Cl. .................................. 369/126; 369/100

(58) Field of Classification Search .................. None
See application file for complete search history.

(56) References Cited

U.S. PATENT DOCUMENTS 6,700,853 B2 * 3/2004 Raese .......................... 369/126
6,738,336 B2 * 5/2004 Naberhuis ................... 369/126

* cited by examiner

*Primary Examiner*—Muhammad Edun
(74) *Attorney, Agent, or Firm*—Robert P. Lenart, Esq.; Pietragallo, Bosick & Gordon LLP

(57) ABSTRACT

The present disclosure relates to a data storage device. The data storage device comprises a closed interior space containing a noble gas, a plurality of electron emitters having emission surfaces exposed within the interior space, the electron emitters adapted to emit electron beams, and a storage medium contained within the interior space in proximity to the electron emitters, the storage medium having a plurality of storage areas that are capable of at least two distinct states that represent data, the state of the storage areas being changeable in response to bombardment by electron beams emitted by the electron emitters.

16 Claims, 4 Drawing Sheets

DATA STORAGE DEVICE

FIELD OF THE INVENTION

The present disclosure relates to a data storage device. More particularly, the disclosure relates to a data storage device including a mechanism for removing contaminants from emission surfaces of electron emitters within the device.

BACKGROUND OF THE INVENTION

Researchers have continually attempted to increase the storage density and reduce the cost of data storage devices such as magnetic hard-drives, optical drives, and dynamic random access memory (DRAM). Recently, semiconductor-based electron sources have been developed that can be used in storage devices and which may avoid the difficulties noted above. An example of such a data storage device is described in U.S. Pat. No. 5,557,596. The device described in that patent includes multiple electron emitters having electron emission surfaces that face a storage medium. During write operations, the electron sources bombard the storage medium with relatively high intensity electron beams. During read operations, the electron sources bombard the storage medium with relatively low intensity electron beams. Such a device provides advantageous results. For instance, the size of storage bits in such devices may be reduced by decreasing the electron beam diameter, thereby increasing storage density and capacity and decreasing storage cost.

During fabrication, various contaminants from the ambient air can form on the electron emission surfaces of the data storage device. Such contaminants include various materials containing oxygen, nitrogen, and/or carbon. Perhaps most problematic of these is carbonaceous materials such as hydrocarbons. The formation of contaminants is disadvantageous in that their presence adversely affects operation of the electron emitters. For instance, the presence of contaminants increases electron scattering. In addition, where the electron emitters comprise field (i.e., tip) emitters, the work function of the emitters can be decreased, lowering the potential needed to emit electron beams from the emitters and thereby raising the currents substantially. This phenomenon makes it more difficult to control operation of the emitters in that the magnitude of the electron beams emitted from the emitters may be greater than desired, therefore increasing the opportunity for misreading and/or miswriting to a storage medium of the device. Removing these contaminants from the atmosphere to prevent their deposition on the electron emission surfaces during fabrication is difficult, if not impossible.

In addition to contaminants present in the ambient air during fabrication, further contaminants can be deposited on the emission surfaces of the electron emitters. For example, if the storage medium of the device is partially decomposed, or if contaminants on the surface are desorbed, during read and/or write operations, volatile components can be released that will settle on the electron emission surfaces. Like the airborne contaminants referenced above, these contaminants can similarly result in electron scattering and may significantly change emitter operational characteristics.

From the foregoing, it can be appreciated that it would be desirable to have a data storage device that employs a mechanism to remove contaminants from the emission surfaces of the electron emitters contained within the device.

SUMMARY OF THE INVENTION

The present disclosure relates to a data storage device. The data storage device comprises a closed interior space containing a noble gas, a plurality of electron emitters having emission surfaces exposed within the interior space, the electron emitters adapted to emit electron beams, and a storage medium contained within the interior space in proximity to the electron emitters, the storage medium having a plurality of storage areas that are capable of at least two distinct states that represent data, the state of the storage areas being changeable in response to bombardment by electron beams emitted by the electron emitters.

In addition, the present disclosure relates to a method for removing contaminants from an electron emission surface of an electron emitter of a data storage device. The method comprises the steps of providing a noble gas within an interior space of the data storage device to which the electron emission surface is exposed, exciting atoms within the gas by impacting them with an electron beam emitted by the electron emitter, wherein the atoms of the gas are ionized by impact with the electron beam and accelerated toward the emission surface to sputter remove the contaminants from the emission surface.

In preferred arrangements, the noble gas used in the device and method comprises neon gas.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
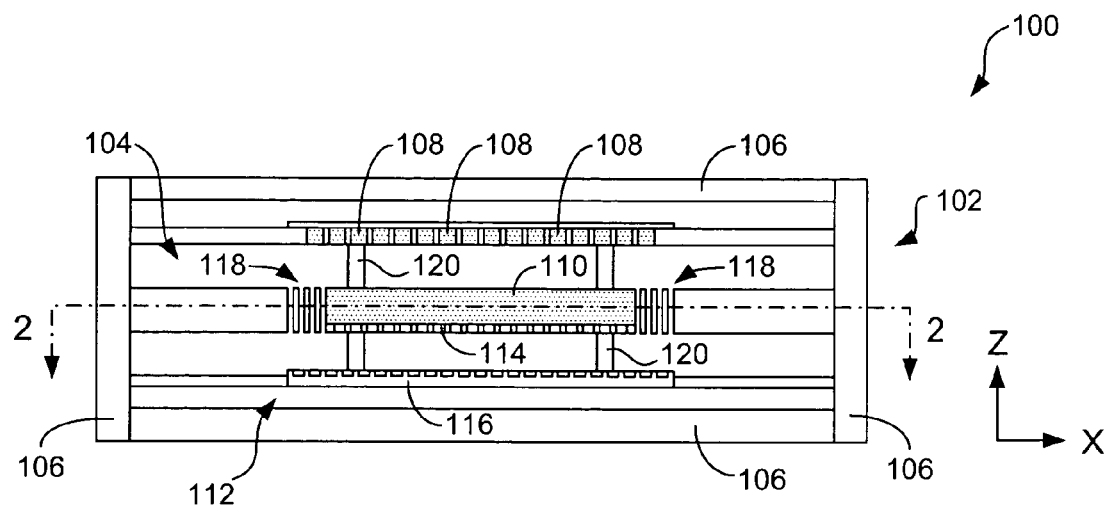
FIG. 1 is a schematic side view of an example data storage device.
Figure 2:
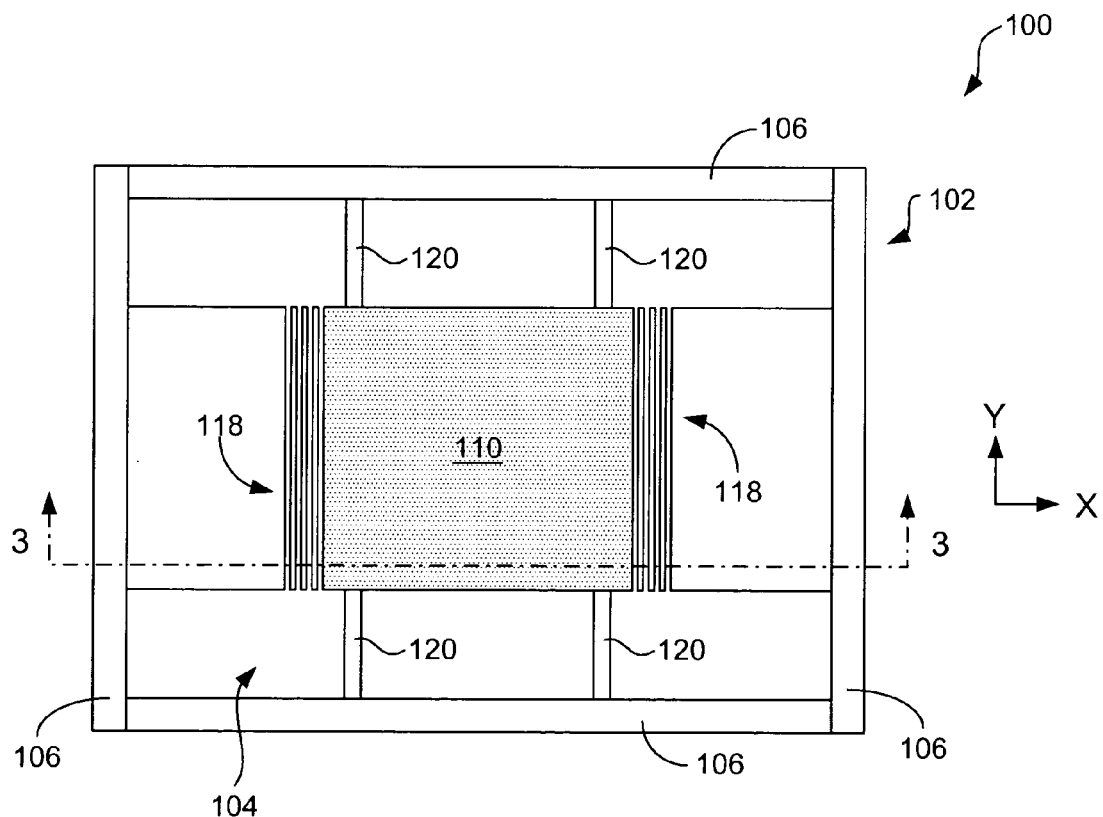
FIG. 2 is a schematic cross-sectional view of the data storage device of FIG. 1 taken along line 2—2.
Figure 3:
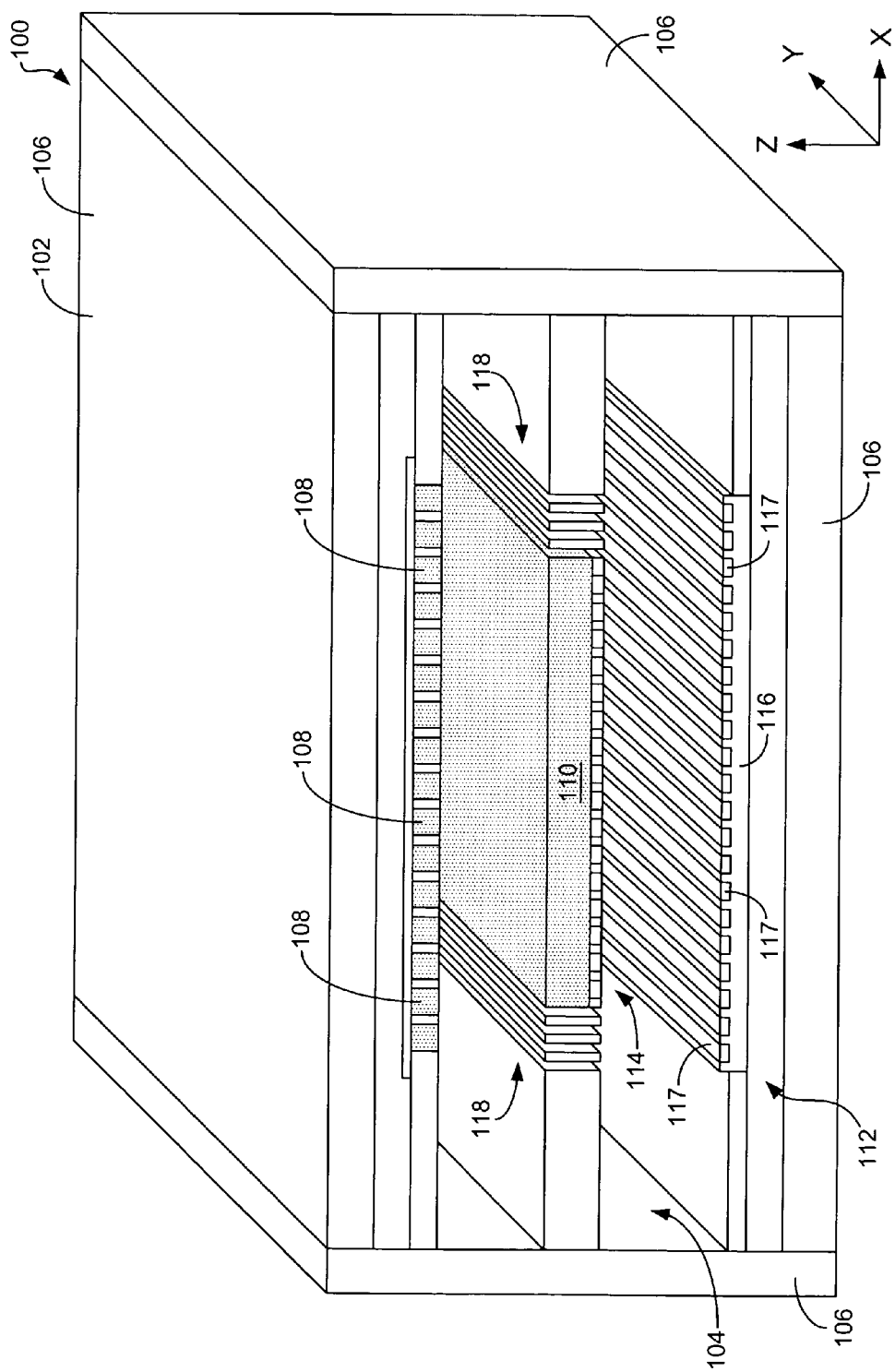
FIG. 3 is a schematic cross-sectional perspective view of the data storage device of FIGS. 1 and 2 taken along line 3—3.

Referring now in more detail to the drawings, in which like numerals indicate corresponding parts throughout the several views, FIGS. 1–3 illustrate an example data storage device 100. It is noted that this device 100 is similar in construction to that described in U.S. Pat. No. 5,557,596, which is hereby incorporated by reference into the present disclosure.

As indicated in FIGS. 1–3 the data storage device 100 generally includes an outer casing 102 that forms an interior space 104 therein. By way of example, the casing 102 can include a plurality of walls 106 that define the interior space 104. Typically, the walls 106 of the casing 102 are sealed to each other such that a vacuum can be maintained within the interior space 104. By way of example, the casing 102 maintains a vacuum of at least approximately 10⁻³ Torr within the interior space 104. As is described in greater detail below, the interior space preferably contains a noble gas, such as neon gas, which removes contaminants from emission surfaces within the device 100. Although a particular configuration is shown for the casing 102, it is to be understood that the casing can take many different forms that would be readily apparent to persons having ordinary skill in the art.

Within the interior space 104 is a plurality of electron emitters 108 that face a storage medium 110. These electron emitters can, for example, comprise field (i.e., tip) emitters as described in U.S. Pat. No. 5,557,596 identified above. Alternatively, the electron emitters 108 can comprise flat emitters such as those described in U.S. patent application Ser. No. 09/836,124, filed Apr. 16, 2001, which is hereby incorporated by reference into the present disclosure. As described in relation to FIG. 4, the storage medium 110 comprises a plurality of storage areas (not visible in FIGS. 1–3). In a preferred embodiment, each storage area of the storage medium 110 is responsible for storing one or more bits of data. The electron emitters 108 are configured to emit electron beam currents toward the storage areas of the storage medium 110 when a predetermined potential difference is applied to the electron emitters. Depending upon the distance between the emitters 108 and the storage medium 110, the type of emitters, and the spot size (i.e., bit size) required, electron optics may be useful in focusing the electron beams. Voltage is also applied to the storage medium 110 to accelerate the emitted electrons to aid in focusing the emitted electrons.

Each electron emitter 108 can serve many different storage areas to write data to and read data from the storage medium 110. To facilitate alignment between each electron emitter 108 and an associated storage area, the electron emitters and storage medium can be moved relative to each other in the X and Y directions noted in FIG. 2. To provide for this relative movement, the data storage device 100 can include a micromover 112 that scans the storage medium 110 with respect to the electron emitters 108. As indicated in FIGS. 1 and 3, the micromover 112 can include a rotor 114 connected to the storage medium 110, a stator 116 that faces the rotor, and one or more springs 118 that are positioned to the sides of the storage medium. As is known in the art, displacement of the rotor 114, and thereby the storage medium 110, can be effected by the application of appropriate potentials to electrodes 117 of the stator 116 so as to create a field that displaces the rotor 114 in a desired manner.

When the micromover 112 is displaced in this manner, the micromover scans the storage medium 110 to different locations within the X-Y plane such that each emitter 108 is positioned above a particular storage area. A preferred micromover 112 preferably has sufficient range and resolution to position the storage areas 110 under the electron emitters 108 with high accuracy. By way of example, the micromover 112 can be fabricated through semiconductor microfabrication processes. Although relative movement between the electron emitters 108 and the storage medium 110 has been described as being accomplished through displacement of the storage medium, it will be understood that such relative movement can alternatively be obtained by displacing the electron emitters or by displacing both the electron emitters and the storage medium. Moreover, although a particular micromover 112 is shown and described herein, it will be appreciated by persons having ordinary skill in the art that alternative moving means could be employed to obtain such relative movement.

Alignment of an emitted beam and storage area can be further facilitated with deflectors (not shown). By way of example, the electron beams can be rastered over the surface of the storage medium 110 by either electrostatically or electromagnetically deflecting them, as through use of electrostatic and/or electromagnetic deflectors positioned adjacent the emitters 108. Many different approaches to deflect electron beams can be found in literature on scanning electron microscopy (SEM).

The electron emitters 108 are responsible for reading and writing information on the storage areas of the storage medium with the electron beams they produce. Therefore, the electron emitters 108 preferably produce electron beams that are narrow enough to achieve the desired bit density for the storage medium 110, and that provide the different power densities needed for reading from and writing to the medium. Particular example embodiments for the electron emitters 108 are provided later in this disclosure.

As indicated in FIGS. 1 and 2, the data storage device 100 can further include one or more supports 120 that support the storage medium 110 in place within the interior space 104. When provided, the supports 120 typically comprise thin-walled microfabricated beams that flex when the storage medium 110 is displaced in the X and/or Y directions. As is further indicated in FIGS. 1 and 2, the supports 120 can each be connected to the walls 106 of the casing 102 or alternatively to the stator 116.

Figure 4:
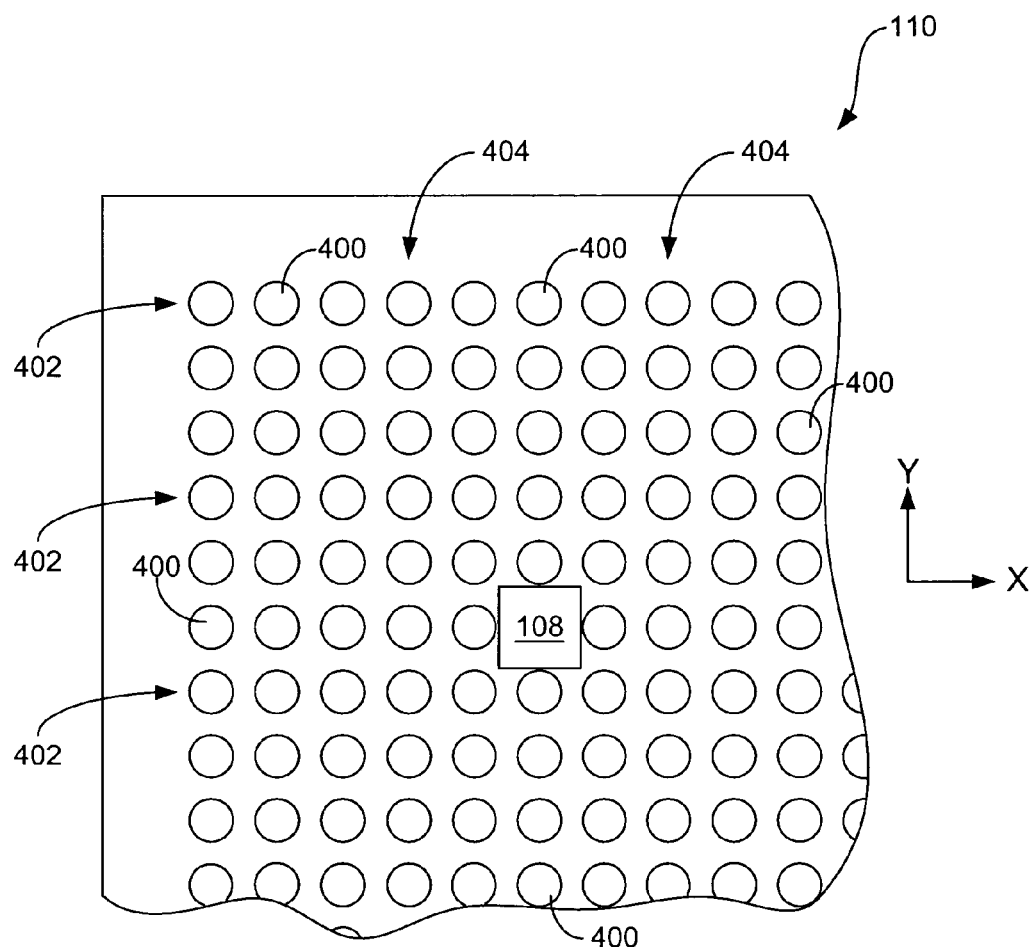
FIG. 4 is a partial schematic view of a storage medium of the data storage device shown in FIGS. 1–3.

In a preferred embodiment, the electron emitters 108 are contained within a two-dimensional array comprising a plurality of emitters. By way of example, an array of 100×100 electron emitters 108 can be provided with an emitter pitch of approximately 5 to 100 micrometers in both the X and Y directions. As discussed above, each emitter 108 typically is used to access a plurality of storage areas of the storage medium 110. FIG. 4 provides a schematic representation of this relationship. In particular, this figure illustrates a single electron emitter 108 positioned above a plurality of storage areas 400 of the storage medium 110. As indicated in FIG. 4, the storage areas 400, like the electron emitters 108, are contained in a two-dimensional array. In particular, the storage areas 400 are arranged in separate rows 402 and columns 404 on the surface of the storage medium 100. In a preferred embodiment, each emitter 108 is only responsible for a portion of the entire length of predetermined numbers of rows 402. Accordingly, each emitter 108 normally can access a matrix of storage areas 400 of particular rows 402 and columns 404. Preferably, each row 402 that is accessed by a single electron emitter 108 is connected to a single external circuit.

To address a storage area 400, the micromover 112 is activated to displace the storage medium 110 (and/or electron emitters 108) to align the storage area with a particular electron emitter. Typically, each emitter 108 can access tens of thousands to hundreds of millions of storage areas 400 in this manner. The storage medium 110 can have a periodicity of approximately 5 to 100 nanometers between any two storage areas 400, and the range of the micromover 112 can be approximately 15 micrometers. As will be appreciated by persons having ordinary skill in the art, each of the electron emitters 108 can be addressed simultaneously or in a multiplexed manner. A parallel accessing scheme can be used to significantly increase the data rate of the storage device 100.

Writing with the data storage device 100 is accomplished by temporarily increasing the power density of an electron beam produced by an electron emitter 108 to modify the surface state of a storage area 400 of the storage medium 110. For instance, the modified state can represent a "1" bit, while the unmodified state can represent a "0" bit. Moreover, the storage areas can be modified to different degrees to represent more than two bits, if desired. In a preferred embodiment, the storage medium 110 is constructed of a material whose structural state can be changed from crystalline to amorphous by electron beams. An example material is germanium telluride (GeTe) and ternary alloys based on GeTe. To change from the amorphous to the crystalline state, the beam power density can be increased and then slowly decreased. This increase/decrease heats the amorphous area and then slowly cools it so that the area has time to anneal into its crystalline state. To change from the crystalline to amorphous state, the beam power density is increased to a high level and then rapidly reduced. Although temporary modification of the storage medium 110 is described herein, it will be understood that permanent modification is possible where write-once-read-many (WORM) functionality is desired.

Reading is accomplished by observing the effect of the electron beam on the storage area 400, or the effect of the storage area on the electron beam. During reading, the power density of the electron beam is kept low enough so that no further writing occurs. In a first reading approach, reading is accomplished by collecting the secondary and/or backscattered electrons when an electron beam with a relatively low (i.e., lower than that needed to write) power density is applied to the storage medium 110. In that the amorphous state has a different secondary electron emission coefficient (SEEC) and backscattered electron coefficient (BEC) than the crystalline state, a different number of secondary and backscattered electrons are emitted from a storage area 400 when bombarded with a read electron beam. By measuring the number of secondary and backscattered electrons, the state of the storage area 106 can be determined.

Figure 5:
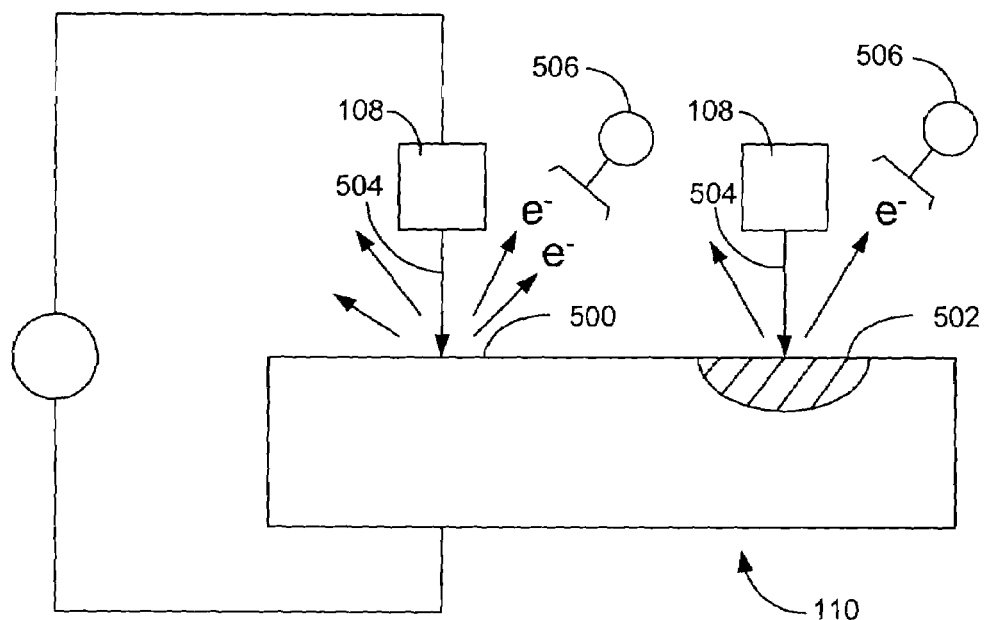
FIG. 5 is a schematic side view of a first example reading arrangement for the data storage device of FIGS. 1–4.

FIG. 5 illustrates example apparatus for reading according to the first reading approach. More particularly, FIG. 5 schematically illustrates electron emitters 108 reading from storage areas 500 and 502 of the storage medium 110. In this figure, the state of storage area 500 has been modified, while the state of storage area 502 has not. When a beam 504 of electrons bombard the storage areas 500, 502 both the secondary electrons and backscattered electrons are collected by electron collectors 506. As will be appreciated by persons having ordinary skill in the art, modified storage area 500 will produce a different number of secondary electrons and backscattered electrons as compared to unmodified storage area 502. The number may be greater or lesser depending upon the type of material and the type of modification made. By monitoring the magnitude of the signal current collected by the electron collectors 506, the state of and, in turn, the bit stored in the storage areas 500 and 502 can be identified.

Figure 6:
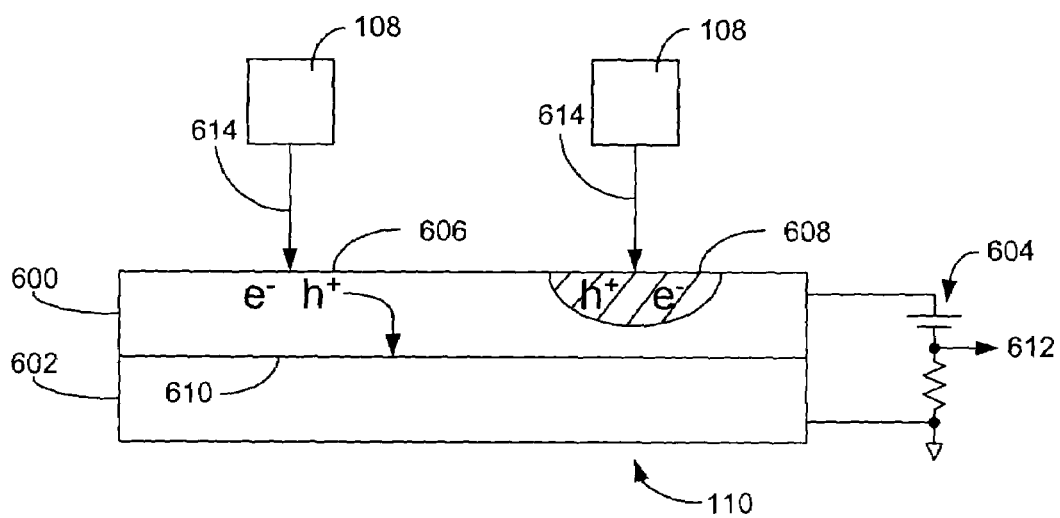
FIG. 6 is a schematic side view of a second example reading arrangement for the data storage device of FIGS. 1–4.

In another reading approach, a diode structure is used to determine the state of the storage areas 400. According to this approach, the storage medium 110 is configured as a diode which can, for example, comprise a p-n junction, a Schottky barrier, or substantially any other type of electronic valve. FIG. 6 illustrates an example configuration of such a storage medium 110. It will be understood that alternative diode arrangements (such as those shown in U.S. Pat. No. 5,557,596) are feasible. As indicated in this figure, the storage medium 110 is arranged as a diode having two layers 600 and 602. By way of example, one of the layers is p type and the other is n type. The storage medium 110 is connected to an external circuit 604 that reverse-biases the storage medium. With this arrangement, bits are stored by locally modifying the storage medium 110 in such a way that collection efficiency for minority carriers generated by a modified region 608 is different from that of an unmodified region 606. The collection efficiency for minority carriers can be defined as the fraction of minority carriers generated by the instant electrons that are swept across a diode junction 610 of the storage medium 110 when the medium is biased by the external circuit 604 to cause a signal current 612 to flow through the external circuit.

In use, the electron emitters 108 emit narrow beams 614 of electrons onto the surface of the storage medium 110 that excite electron-hole pairs near the surface of the medium. Because the medium 110 is reverse-biased by the external circuit 604, the minority carriers that are generated by the incident electrons are swept toward the diode junction 610. Electrons that reach the junction 610 are then swept across the junction. Accordingly, minority carriers that do not recombine with majority carriers before reaching the junction 610 are swept across the junction, causing a current flow in the external circuit 604.

As described above, writing is accomplished by increasing the power density of electron beams enough to locally alter the physical properties of the storage medium 110. Where the medium 110 is configured as that shown in FIG. 6, this alteration affects the number of minority carriers swept across the junction 610 when the same area is radiated with a lower power density read electron beam. For instance, the recombination rate in a written (i.e., modified) area 608 could be increased relative to an unwritten (i.e., unmodified) area 606 so that the minority carriers generated in the written area have an increased probability of recombining with minority carriers before they have a chance to reach and cross the junction 610. Hence, a smaller current flows in the external circuit 604 when the read electron beam is incident upon a written area 608 than when it is incident upon an unwritten area 606. Conversely, it is also possible to start with a diode structure having a high recombination rate and to write bits by locally reducing the recombination rate. The magnitude of the current resulting from the minority carriers depends upon the state of particular storage area, and the current continues the output signal 612 to indicate the bit stored.

As identified above, various contaminants can form on the electron emission surfaces of the electron emitters 108 during fabrication of the data storage device 100 and/or thereafter. The interior space 104 of the data storage device 100 therefore preferably contains a noble gas that removes the contaminants from the emitter emission surfaces during use of the emitters. In a preferred arrangement, this noble gas comprises neon gas. Neon gas is preferable because it is massive enough to remove the contaminants, yet not so massive as to damage the electron emitters 108.

The mechanism with which the selected gas removes the contaminants from the electron emitters pertains to ionization of the gas during data storage device use. Specifically, when an electron beam is emitted from an electron emitter 108, the beam impacts atoms of the gas, exiting them to the point at which the atoms lose an electron and therefore ionize. Due to their positive charge, the generated ions are attracted to the negative charge of the electron emitters 108, and are accelerated toward the electron emitters such that they ultimately bombard the emission surfaces of the electron emitters. In that the ions have a mass similar to that of the contaminants residing on the emission surface, the contaminants are displaced (i.e., sputter removed) from the surface by the ions, thereby cleaning the emission surfaces and ensuring proper operation of the electron emitters 108.

The strength of the vacuum maintained within the interior space may depend upon the type of electron emitters 108 used in the fabrication of the data storage device 100. Due to the use of the gas within the interior space 104, the vacuum need not be as strong as when air remains within the space. By way of example, where field emitters are used, the vacuum preferably is approximately $10^{-4}$ to $10^{-6}$ Torr, with $10^{-3}$ Torr possible. For flat emitters, the vacuum preferably is approximately $10^{-3}$ to $10^{-6}$ Torr. In any case, however, the strength of the vacuum is maintained such that plasma generation within the interior space 104 is avoided.

While particular embodiments of the invention have been disclosed in detail in the foregoing description and drawings for purposes of example, it will be understood by those skilled in the art that variations and modifications thereof can be made without departing from the scope of the invention as set forth in the following claims.

What is claimed is:

1. A data storage device, comprising:
   a closed interior space containing a noble gas;
   a plurality of electron emitters having emission surfaces exposed within the interior space, the electron emitters adapted to emit electron beams; and
   a storage medium contained within the interior space in proximity to the electron emitters, the storage medium having a plurality of storage areas that are capable of at least two distinct states that represent data, the state of the storage areas being changeable in response to bombardment by electron beams emitted by the electron emitters.

2. The device of claim 1, wherein the interior space is maintained in a vacuum.

3. The device of claim 2, wherein the vacuum is less than approximately $10^{-6}$ Torr.

4. The device of claim 3, wherein the vacuum is greater than approximately $10^{-3}$ Torr.

5. The device of claim 1, wherein the electron emitter comprises a field emitter.

6. The device of claim 1, wherein the electron emitter comprises a flat emitter.

7. A data storage device, comprising:
   a closed interior space;
   a plurality of electron emitters having emission surfaces exposed within the interior space, the electron emitters adapted to emit electron beams;
   a storage medium contained within the interior space in proximity to the electron emitters, the storage medium having a plurality of storage areas that are capable of at least two distinct states that represent data, the state of the storage areas being changeable in response to bombardment by electron beams emitted by the electron emitters; and
   means for removing contaminants from the emission surface of the electron emitter.

8. The device of claim 7, wherein the means for removing contaminants from the emission surface comprise noble gas provided within the interior space.

9. The device of claim 7, wherein the interior space is maintained in a vacuum.

10. The device of claim 9, wherein the vacuum is less than approximately $10^{-6}$ Torr.

11. The device of claim 9, wherein the vacuum is greater than approximately $10^{-3}$ Torr.

12. The device of claim 7, wherein the electron emitter comprises a field emitter.

13. The device of claim 7, wherein the electron emitter comprises a flat emitter.

14. A method for storing data, comprising the steps of:
    forming a data storage device including an interior space;
    providing a noble gas within the interior space; and
    sealing the interior space such that the space is maintained in a vacuum.

15. The method of claim 14, wherein the data storage device includes an electron emitter adapted to emit electron beams and a storage area that is capable of at least two distinct states that represent data.

16. A method for removing contaminants from an emission surface of an electron emitter of a data storage device, comprising the steps of:
    providing a noble gas within an interior space of the data storage device to which the emission surface is exposed; and
    exciting atoms within the gas by impacting them with an electron beam emitted by the electron emitter;
    wherein the atoms of the gas are ionized by impact with the electron beam and accelerated toward the emission surface to sputter remove the contaminants from the emission surface.

* * * * *